United States Patent [19]

Asahina et al.

[11] Patent Number: 4,826,781

[45] Date of Patent: May 2, 1989

[54] SEMICONDUCTOR DEVICE AND METHOD OF PREPARATION

[75] Inventors: Michio Asahina; Makio Goto, both of Nagano, Japan

[73] Assignee: Seiko Epson Corporation, Tokyo, Japan

[21] Appl. No.: 21,055

[22] Filed: Mar. 2, 1987

[30] Foreign Application Priority Data

| Mar. 4, 1986 | [JP] | Japan | 61-46718 |
| Mar. 7, 1986 | [JP] | Japan | 61-49758 |
| May 9, 1986 | [JP] | Japan | 61-105959 |
| Jan. 23, 1987 | [JP] | Japan | 62-13437 |

[51] Int. Cl.⁴ .......................................... H01L 21/265
[52] U.S. Cl. ............................ 437/41; 437/60; 437/48; 437/47; 437/225; 437/984; 156/653; 156/657
[58] Field of Search ............ 437/41, 47, 48, 51, 437/52, 59, 60, 225, 235, 228, 919, 193, 984; 148/DIG. 14; 357/23.6; 156/643, 653, 657

[56] References Cited

U.S. PATENT DOCUMENTS

| 3,849,216 | 11/1974 | Salters | 437/984 |
| 3,961,355 | 6/1976 | Abbas et al. | 357/23.6 |
| 4,274,909 | 6/1981 | Venkataraman | 437/31 |
| 4,353,086 | 10/1982 | Jaccodine et al. | 437/64 |
| 4,378,630 | 4/1983 | Horng et al. | 437/233 |
| 4,433,470 | 2/1984 | Kameyama et al. | 357/59 H |
| 4,478,655 | 10/1984 | Nagakubo et al. | 437/62 |
| 4,478,679 | 10/1984 | Chang et al. | 437/41 |
| 4,523,369 | 6/1985 | Nagakubo | 437/67 |
| 4,523,696 | 8/1985 | Iwai | 437/67 |
| 4,673,962 | 6/1987 | Chatterjee et al. | 357/23.6 |

FOREIGN PATENT DOCUMENTS

| 3023410 | 7/1982 | Denmark . |
| 0138517 | 10/1984 | European Pat. Off. . |
| 107768 | 10/1984 | Japan . |
| 81/03241 | 11/1981 | PCT Int'l Appl. . |

OTHER PUBLICATIONS

Ghandhi, "VLSI Fabrication Principles", 1983, pp. 586–587, 6a4–6a5.

Primary Examiner—Brian E. Hearn
Assistant Examiner—Kevin McAndrews
Attorney, Agent, or Firm—Blum Kaplan

[57] ABSTRACT

A method for preparing an improved semiconductor device having a transistor and a capacitor or an element isolating region in or on a semiconductor substrate by a self-alignment process is provided. Each of the elements is formed using a previously formed element as a mask so that no additional processes are necessary to align the elements at the desired position. Specifically, a gate electrode is formed first and then a capacitor, element isolating region and contact hole are formed in such a way that the room required for alignment of the gate electrode and the capacitor, the gate electrode and the element isolating region and the gate electrode and the contact hole is reduced. The process is extremely advantageous for miniaturization of the semiconductor device. The device prepared by such a process is also provided.

35 Claims, 9 Drawing Sheets

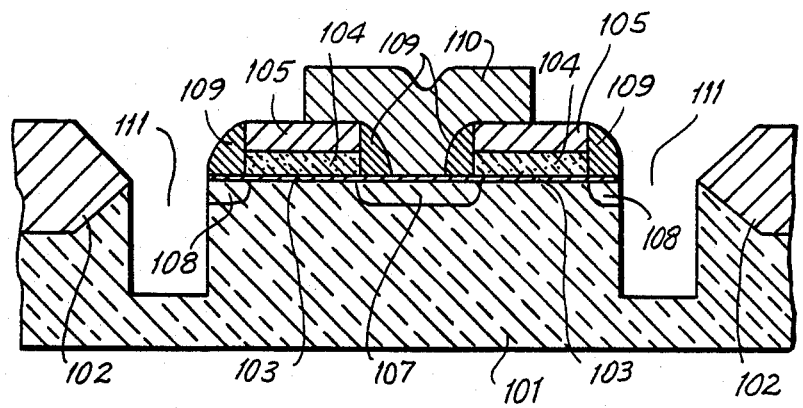
FIG. IE
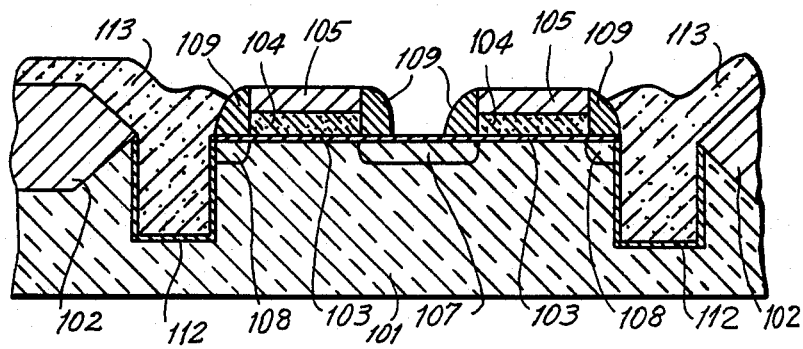
FIG. IF
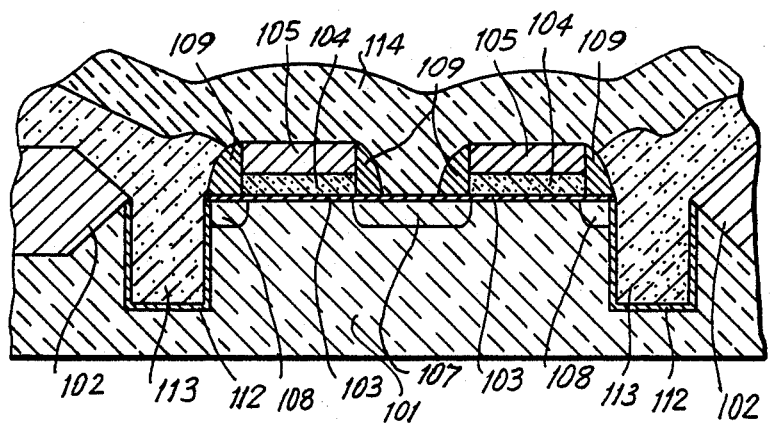
FIG. IG
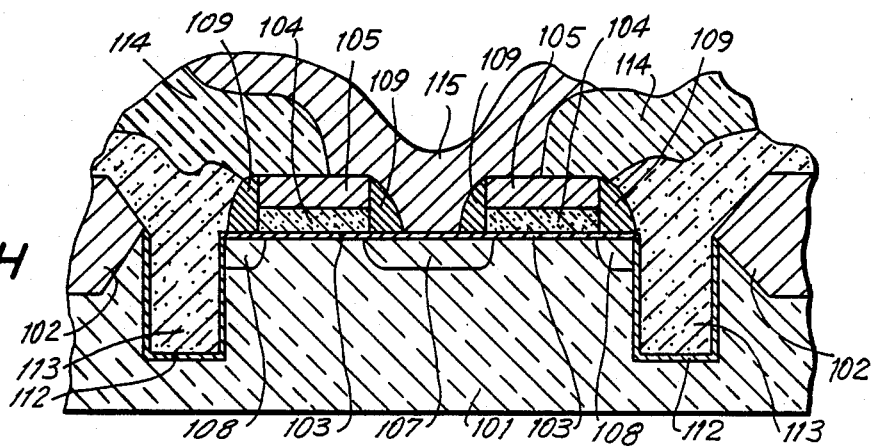
FIG. IH

SEMICONDUCTOR DEVICE AND METHOD OF PREPARATION

BACKGROUND OF THE INVENTION

The present invention relates generally to semiconductor devices and methods of preparation of such devices and, in particular, to miniaturized semiconductor devices prepared by self-alignment processes.

Prior art semiconductor devices, particularly, semiconductor memory devices having capacitors are generally formed by processes that include the steps of formulation of an element isolating region, formation of a capacitor region by forming a groove or by a layering process and then formation of a gate electrode and contact hole.

Reference is made to FIG. 6 wherein a prior art semiconductor device is shown. First element isolating oxide film 602 is formed in silicon substrate 601 by a known technique. Stopper region 603 is formed simultaneously. Gate oxide film 604 is formed on substrate 601 and gate electrode 605 is formed of polysilicon on gate oxide film 604. Low density diffused region 607 is formed in silicon substrate 601 using gate electrode 605 as a mask. Sidewall oxide film 608 is formed along the edges of gate electrode 605. Titanium is applied to the through surface of the device to form electrode portion 606 on gate electrode 605 and diffused region 609 on low density diffused region 607. Accordingly, electrode portion 606 and diffused regions 609 are formed as $TiSi_2$ by a self-aligning process. An impurity is diffused by ion implantation and interlayer insulating film 611 is formed on the device. The device is annealed to form the source and drain diffused regions 610 under the $TiSi_2$. A contact hole is formed by contact etching and an aluminum alloy connector 612 is deposited in the contact hole.

In the process described, it is necessary to arrange each of the elements such as capacitors, element isolating regions, gate electrodes and contact holes while allowing room for alignment of the gate electrode with each of the capacitor, the element isolating regions, the gate electrodes and the contact holes. The necessity of providing alignment space prevents the device from being miniaturized.

Furthermore, when the field insulating film of prior art semiconductor devices is formed by selective oxidation of the substrate (also known as "local oxidation of silicon" or "LOCOS"), it is necessary to form an anti-oxidation mask on the portion of the substrate where oxidation is not desired. The anti-oxidation mask is removed after forming the field insulating film, but the end portion of the film generally protrudes undesirably. This undesirable projection is known as a "bird's beak" and causes defects including disconnection of connectors formed in later process steps.

It is, therefore, desirable to provide a method for making a semi-conductor device that does not require alignment space to be maintained between the elements, thereby allowing the device to be miniaturized.

SUMMARY OF THE INVENTION

Generally speaking, in accordance with the invention a method for preparing an improved semiconductor device having a transistor and a capacitor or an element isolating region in or on a semiconductor substrate by a self-alignment process is provided. Each of the elements is formed using a previously formed element as a mask so that no additional processes are necessary to align the elements at the desired position. Specifically, a gate electrode of the transistor is formed first and then a capacitor, element isolating region and contact hole are formed in such a way that the room required for alignment of the gate electrode and the capacitor, the gate electrode and the element isolating region and the gate electrode and the contact hole is reduced. The process is extremely advantageous for miniaturization of the semiconductor device.

It is, therefore, an object of the invention to provide a high density miniaturized semiconductor device.

It is another object of the invention to provide a semiconductor device having high response speed in which diffusion capacitance and resistance are greatly reduced.

It is still another object of the invention to provide a semiconductor device wherein the capacitance between the substrate and the diffused region is reduced to about zero.

It is yet another object of the invention to provide a semiconductor device wherein the "bird's beak" of the field oxide film is eliminated.

It is a further object of the invention to provide a method for preparing a high density miniaturized semiconductor device.

It is a still further object of the invention to provide a method for preparing a semiconductor device by a self-alignment process.

It is yet a further object of the invention to provide a method for preparing a high density, high response speed semi-conductor device in which the diffusion capacitance and resistance are greatly reduced.

It is another object of the invention to provide a method of preparing a semiconductor device that eliminates the "bird's beak" in the field oxide film.

Still other objects and advantages of the invention will in part be obvious and will in part be apparent from the specification.

The invention according comprises the several steps and the relation of one or more of such steps with respect to each of the others, and the article possessing the features, properties and the relation of elements, which are exemplified in the following detailed disclosure, and the scope of the invention will be indicated in the claims.

DESCRIPTION OF THE DRAWINGS

For a fuller understanding of the invention, reference is had to the following description taken in connection with the accompanying drawings, in which:

FIGS. 1A to 1H illustrate a method of manufacturing a semiconductor device in accordance with the invention;

DETAILED DESCRIPTION OF THE PREFERRED EMBODIMENTS

The present invention provides a method of manufacturing a semiconductor device including the steps of forming a groove in a substrate using a self-aligning process with the gate electrode as a mask, forming an insulating region in the groove for separating the elements and forming a diffused region on the element isolating insulating region so that the capacitance of the diffusion region is reduced to a minimum and high response speed is achieved. Accordingly, resistance-capacitance delay is greatly reduced.

Figure 6:
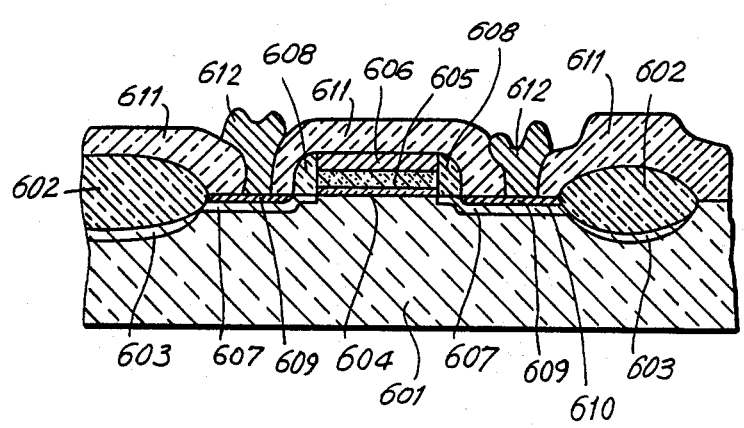
FIG. 6 is a sectional view of a prior art semiconductor device.

In the prior art structure shown in FIG. 6, diffusion resistance is reduced. However, the diffusion capacitance, i.e. the capacitance between the substrate and the diffused region, is not reduced. In a large scale integrated circuit device having a multiplicity of diffusion connectors in addition to the source and drain regions, response time is reduced primarily as a result of reduced diffusion capacitance. The reduction in diffusion capacitance and, therefore, the total response time of the device, depends on integration and miniaturization of the elements. However, in the prior art device shown, integration of the elements is prevented by the "bird's beak".

According to the method of the invention, the factors that have a detrimental effect on the response speed of prior art semiconductor devices are eliminated. Specifically, the method of manufacture provided leads to elimination of the "bird's beak" and reduction of the capacitance between the substrate and the diffused region to almost zero.

Figure 1A:
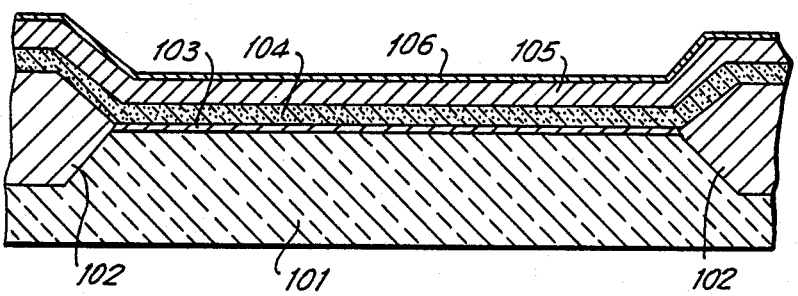

With reference to FIGS. 1A to 1H, a first embodiment of a method for manufacturing a semiconductor device in accordance with the invention is depicted. FIG. 1A shows an element isolating oxide film 102 formed on a P-type semiconductor substrate 101. Gate oxide film 103 is formed between adjacent element isolating oxide films 102 on P-type semiconductor substrate 101 by thermal oxidation. First polycrystalline silicon layer 104 having a thickness between about 2000 and 4000 Å is formed on gate oxide film 103 by chemical vapor deposition and phosphorus is thermally diffused into first polycrystalline silicon layer 104 at a temperature between about 800° and 1000° C.

First nitride film 105 having a thickness between about 2000 and 4000 Å is formed by chemical vapor deposition on first polycrystalline silicon layer 104. Thermal oxide film 106 having a thickness between about 100 and 200 Å is formed on first nitride film 105 at a temperature between about 1000° and 1200° C.

Figure 1B:
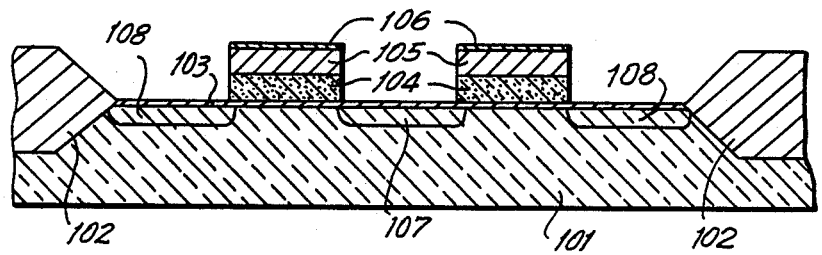

As shown in FIG. 1B, thermal oxide film 106 is etched using a resist pattern mask and then thermal oxide film 106 is used as a mask to etch first nitride film 105. First polycrystalline silicon layer 104 is etched using first nitride film 105 as a mask. An N-type impurity is diffused by ion implantation on either side of the gate and the device is annealed to form N-type diffusion regions 107 and 108, respectively.

Figure 1C:
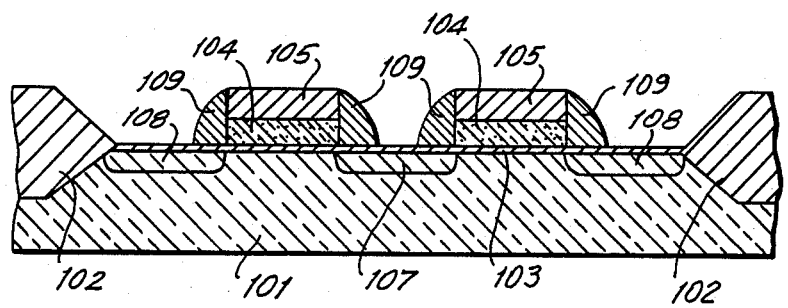

As shown in FIG. 1C, a second nitride film is formed on the through surface of the device to a thickness of between about 2000 and 4000 Å by chemical vapor deposition. Then the total surface is etched with reactive ions to form nitride side wall 109.

Figure 1D:
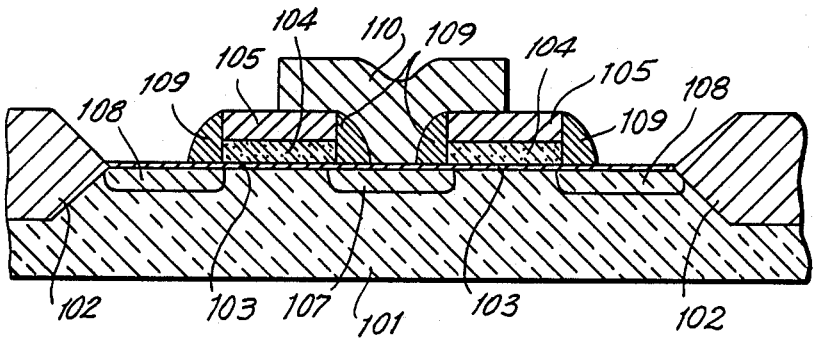

FIG. 1D shows masking of N-type diffusion region 107 with resist pattern 110. Then gate oxide film 103 is selectively removed in a portion of the area of N-type diffusion region 108 using dilute hydrofluoric acid.

As shown in FIG. 1E using resist pattern 110, element isolating oxide film 102, first nitride film 105 and nitride side wall 109 as a mask, P-type semiconductor substrate 101 is anisotropically etched to a depth between about 3 and 5μ to form capacitor region 111. Etching of P-type semiconductor substrate 101 can be accomplished, for example, by reactive ion etching (RIE).

Referring to FIG. 1F, resist pattern 110 is removed and capacitor region 111 is thermally oxidized to form capacitor oxide film 112. Second polycrystalline silicon layer 113 is formed in capacitor region 111 by chemical vapor deposition. Using a resist pattern mask, second polycrystalline silicon layer 113 is etched to form a capacitor electrode.

As shown in FIG. 1G, interlayer insulating oxide film 114 is formed on the device to a thickness of between about 3000 and 6000 Å by chemical vapor deposition. Finally, as shown in FIG. 1H, interlayer insulating oxide film 114 is etched using a resist pattern mask to form a contact hole and connector material 115 such as aluminum is formed in the contact hole by sputtering.

As can be seen, in accordance with the first embodiment of the invention, the capacitor and contact hole are self-aligned with respect to the gate electrode. Such self-alignment is extremely advantageous for reducing the size of the device.

Figure 2A:
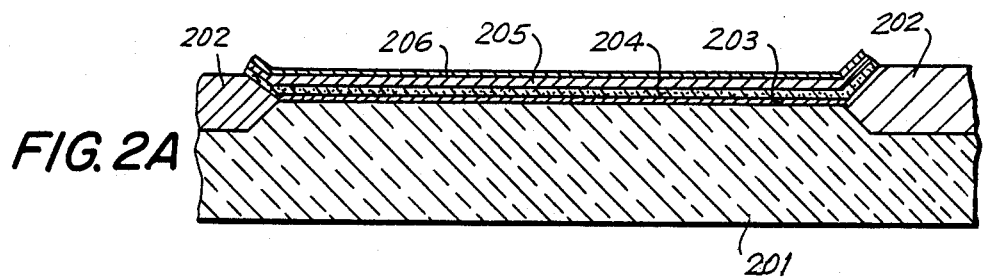
FIGS. 2A to 2K illustrate an alternate method of manufacturing a semiconductor device in accordance with the invention.

An alternate embodiment of the invention is depicted in FIGS. 2A to 2K. Referring to FIG. 2A, an element isolating oxide film 202 is formed on P-type semiconductor substrate 201. Gate oxide film 203 is then formed on the remainder of the substrate by thermal oxidation to a thickness between about 100 and 200 Å. A first polycrystalline silicon layer 204 is formed on gate oxide film 203 by chemical vapor deposition to a thickness between about 1500 and 2500 Å. Phosphorus is thermally diffused into the device at a temperature between about 800° and 1000° C.

A first nitride film 205 having a thickness between about 2000 and 4000 Å is formed by chemical vapor deposition on first polycrystalline silicon layer 204 and a thermal oxide film 206 having a thickness between about 100 and 200 Å is formed on the surface of first nitride film 205 at a temperature between about 1000° and 1200° C.

Figure 2B:
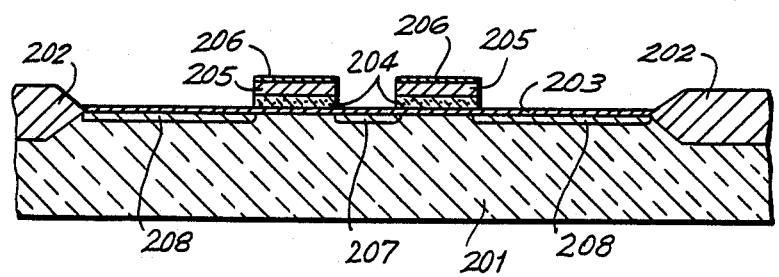

Referring to FIG. 2B, thermal oxide film 206 is etched using a resist pattern as a mask. Then first nitride film 205 is etched using thermal oxide film 206 as a mask and first polycrystalline silicon layer 204 is etched using first nitride film 205 as a mask. An N-type impurity is diffused by ion implantation and the device is thermally annealed to form N-type diffused regions 207 and 208 in substrate 201.

Figure 2C:
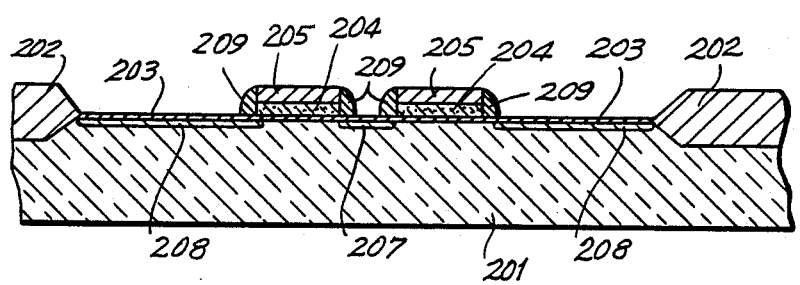

Referring to FIG. 2C, a second nitride film having a thickness between about 2000 and 4000 Å is formed on the through surface of the device of chemical vapor deposition. Then the surface is etched using reactive ion etching to form nitride side walls 209.

Figure 2D:
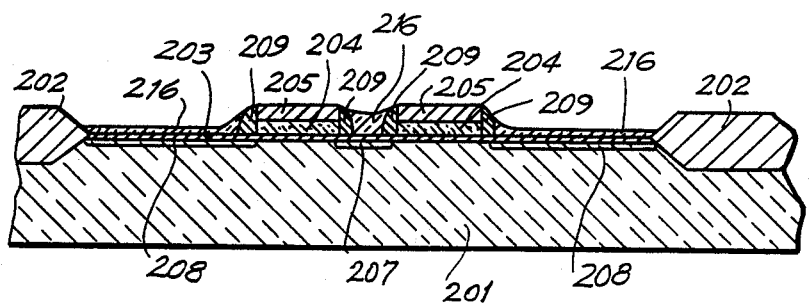

The entire surface of the device is coated with a silica series coating film 216 using a spin coating method. The coated device is baked on a hot plate at a temperature between about 100° and 200° C. and is then annealed in a nitride atmosphere at a temperature between about 800° and 1000° C. As can be seen in FIG. 2D, silica series coating film 216 is thicker in the portions where the patterns are dense as compared with other portions.

Figure 2E:
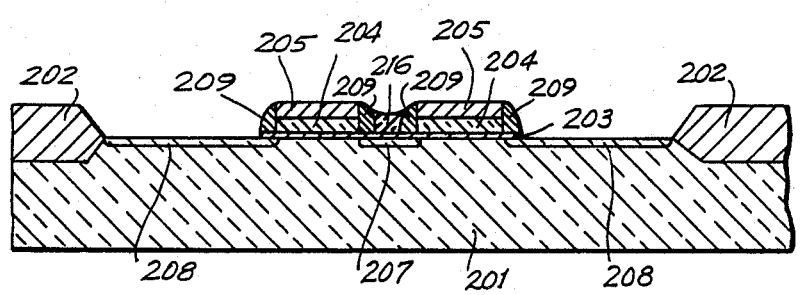

As shown in FIG. 2E, the thickness of silica series coating film 216 is reduced using dilute hydrofluoric acid. Accordingly, silica coating film 16 remains only at the portion between the gate electrodes.

Figure 2F:
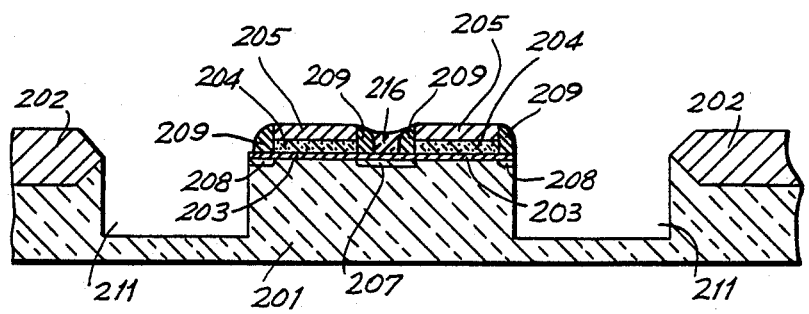

Referring to FIG. 2F, silica series coating film 216, element isolating oxide film 202, first nitride film 205 and nitride side walls 209 are used as a mask to anisotropically etch P-type semiconductor substrate 201. The etching can be accomplished, for example, using reactive ion etching to a depth between about 3 and 5μ in order to form capacitor region 211.

Figure 2G:
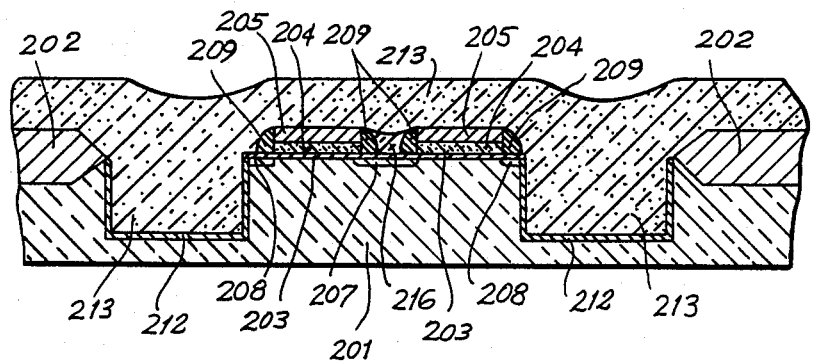

Referring to FIG. 2G, capacitor region 211 is thermally oxidized to form capacitor oxide film 212 having a thickness between about 100 and 200 Å. Then a second polycrystalline silicon layer 213 having a thickness between about 5 and 6μ is deposited by chemical vapor deposition.

Figure 2H:
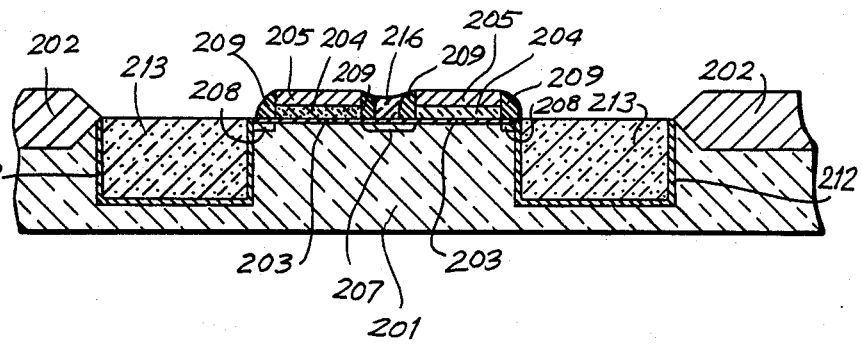

As shown in FIG. 2H, the surface of second polycrystalline silicon layer 213 is anisotropically etched, for example, using reactive ion etching (RIE) to form the capacitor electrode.

Figure 2I:
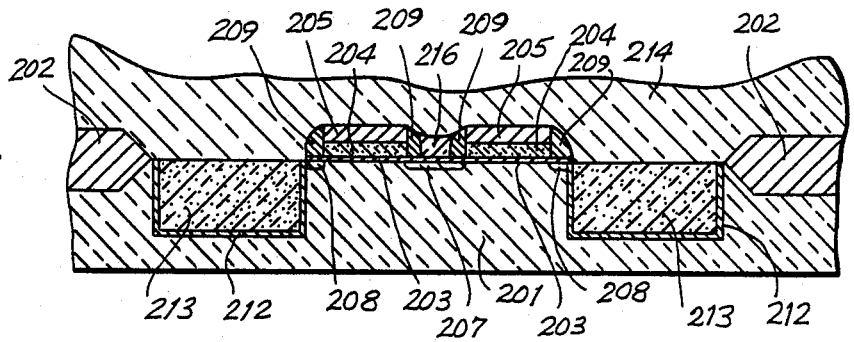

Referring to FIG. 2I, interlayer insulating oxide film 214 having a thickness between about 3000 and 6000 Å is formed on the entire device by chemical vapor deposition.

Figure 2J:
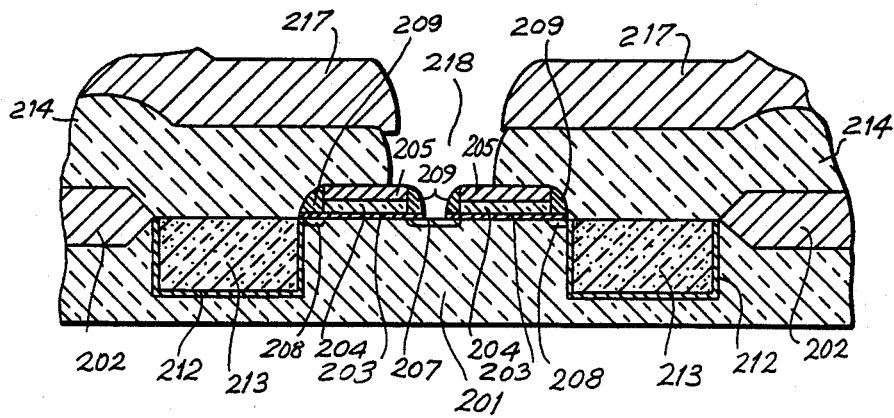

As shown in FIG. 2J, resist pattern 217 is used as a mask to etch a selected portion of interlayer insulating oxide film 214, silica series coating film 216 and gate oxide film 203 in order to form contact hole 218.

Figure 2K:
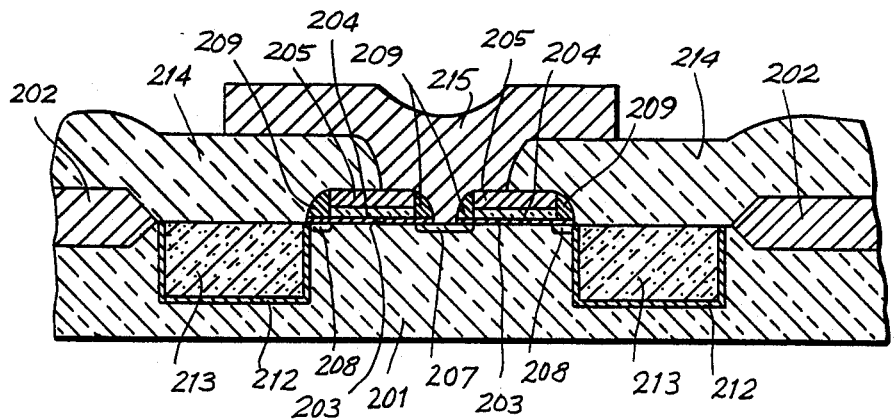

Referring to FIG. 2K, resist pattern 217 is removed and connector material 215 is formed in contact hole 218, for example, by sputtering. In a preferred embodiment, connector material 215 is aluminum.

As described in connection with this second embodiment of the invention, the capacitor and contact hole are self-aligned with respect to the gate electrode. Accordingly, the size of the device can be reduced significantly.

Figure 3A:
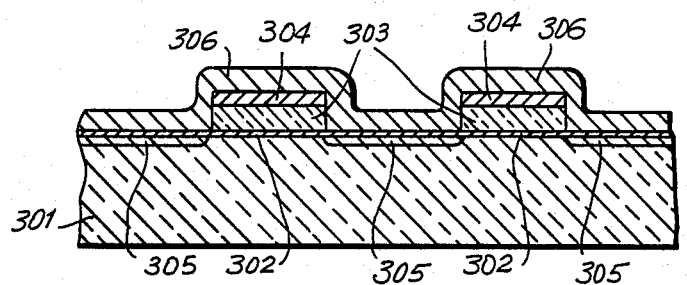
FIGS. 3A to 3E illustrate a further alternate method of manufacturing a semiconductor device in accordance with the invention.

A third alternate embodiment of the invention is depicted in FIGS. 3A to 3E. Referring to FIG. 3A, gate oxide film 302 is formed on silicon substrate 301 to a thickness of up to about 200 Å. An MoSi$_2$ gate electrode is formed on gate oxide film 302. The gate electrode consists of a polycrystalline silicon layer 303 doped with phosphorus and having a thickness of up to about 1500 Å on gate oxide film 302 and a molybdenum silicide layer 304 having a thickness of up to about 2500 Å on polycrystalline silicon layer 303. Using the gate electrode as a mask, a low density diffused region 305 is formed in silicon substrate 301 between adjacent gate electrodes. A plasma nitride film 306 having a thickness of up to about 5000 Å is formed on the entire device.

Figure 3B:
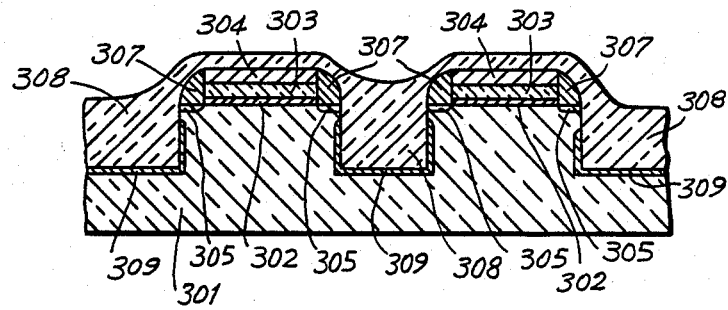

Referring to FIG. 3B, plasma nitride film 306 is etched to form side wall film 307 at the side of the gate electrode. Then silicon substrate 301 is anisotropically etched to a depth of about 7000 Å using side wall film 307 and the gate electrode as a mask. A boron silicate glass (BSG) film 308 having a thickness up to about 8000 Å is formed on the entire device and the device is annealed with a lamp for 30 seconds at a temperature of about 1100° C. in order to cause the BSG film 308 to flow and form stopper layer 309 and element isolating oxide film 310.

Figure 3C:
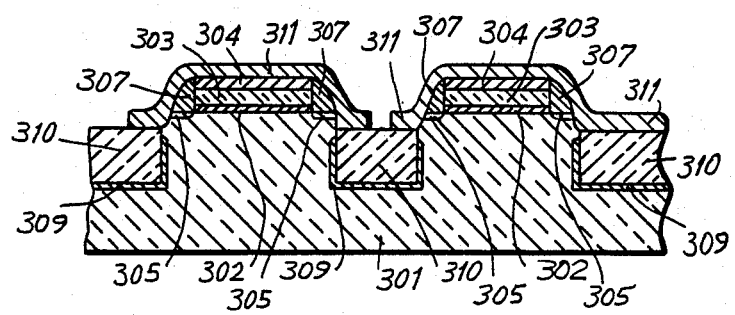

Referring to FIG. 3C, BSG film 308 is etched to expose a silicon portion beneath side wall film 307. A titanium (Ti) layer 311 is then deposited over the gate electrode, side wall film 307 and the exposed silicon portion beneath side wall film 307. Ti layer 311 is selectively etched to form regions corresponding to prior art source and drain regions.

Figure 3D:
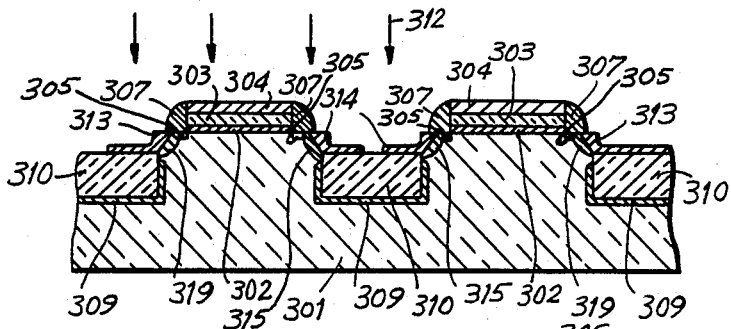

Referring to FIG. 3D, Ti layer 311 is lamp annealed and silicon substrate 301 is converted into TiSi$_2$ layer 313. In addition, the Ti layer on the element isolating oxide film 310 reacts with some of the silicon dioxide to form a thin Ti$_x$Si$_y$ layer 314. Since no silicide is produced at the gate electrode or at side wall film 307, the Ti layer can be selectively etched and source and drain regions are formed on element isolating oxide film 310 and on substrate 301.

An impurity 312 is diffused by ion implantation on one side of the device and the device is lamp annealed. Diffused region 315 is formed in substrate 301 through TiSi$_2$ layer 313 in contact with silicon.

Figure 3E:
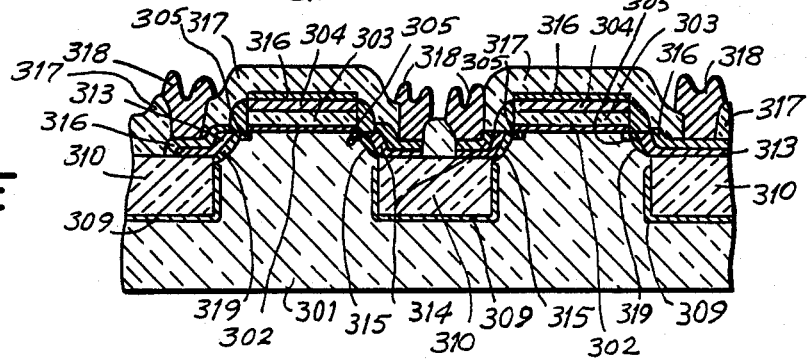

Referring to FIG. 3E, tungsten layer 316 is selectively formed on the TiSi$_2$ region and the MoSi$_2$ electrode to separate the gate, source and drain regions. In this manner, gate, source and drain regions having low resistance are provided. An interlayer insulating film 317 of silicon dioxide having a thickness of up to about 2μ is formed under reduced pressure on the electrodes. Then aluminum connector 318 is formed by contact etching.

As can be seen, in the third embodiment of the invention, the diffused region is formed on the element isolating oxide film as compared with prior art formation in the silicon substrate. Furthermore, a semiconductor device having low resistance and including an element isolating oxide film without a "bird's beak" is constructed and the elements are formed by a self-aligning process using the gate electrode as a mask. Accordingly, the diffusion capacitance is reduced significantly and a device that is capable of high density integration is provided.

It is to be understood that the diffused region includes the connector for extracting electric signals from the junction of the source and drain regions of the transistor. Furthermore, in this embodiment the diffused regions can be arbitrarily connected and the type of wiring used in the prior art becomes unnecessary. Accordingly, the integrity of each of the elements is increased.

As described, the gate electrode is formed of molybdenum polycide, i.e. a layer of molybdenum over a layer of polycrystalline silicon. However, other materials including polysilicon, metal and metal nitride can also be used to form the gate electrode. In addition, the material used to form the diffused region is not limited to the material described. Finally, the elements can be isolated by thermal oxidation in addition to chemical vapor deposition.

Figure 4A:
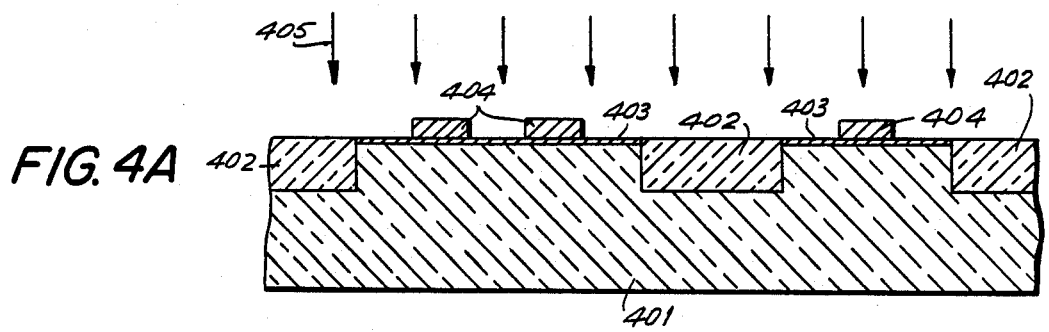
FIGS. 4A to 4G illustrate a still further alternate method of manufacturing a semiconductor device in accordance with the invention.

The fourth embodiment of the invention is described in detail with reference to FIGS. 4A to 4G and FIG. 5, which indicates that there are numerous applications in which the method of the invention is useful. Referring to FIG. 4A, silicon substrate 401 is anisotropically etched, for example, with reactive ions (RIE) to form a groove. Polycrystalline silicon is filled in the groove and oxidized to form element isolating silicon dioxide layer 402 which is equivalent to prior element isolating regions. Gate insulating oxide film 403 having a thickness up to about 200 Å is formed on substrate 401 between adjacent element isolating oxide layers 402. Gate electrode 404 is formed on gate insulating oxide film 403 using a tungsten (W) film having a thickness up to about 3000 Å. Using gate electrode 404 as a mask, low concentration P$^+$ ions are implanted in order to protect the device from hot electrons.

Figure 4B:
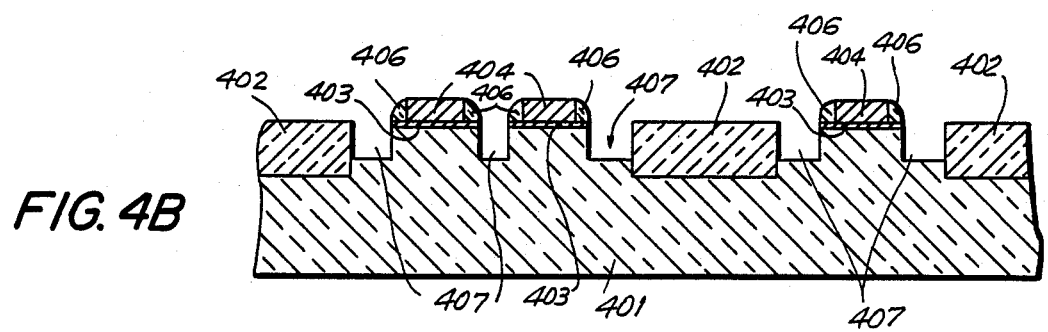

Referring to FIG. 4B, silicon dioxide side wall film 406 is formed at the side of gate electrode 404 by anisotropic etching using, for example, RIE. Then silicon substrate 401 is anisotropically etched using silicon dioxide side wall film 406, gate electrode 404 and element isolating silicon dioxide layer 402 as a mask. Etching can be accomplished, for example, using RIE to form groove 407 having a depth up to about 7000 Å.

Figure 4C:
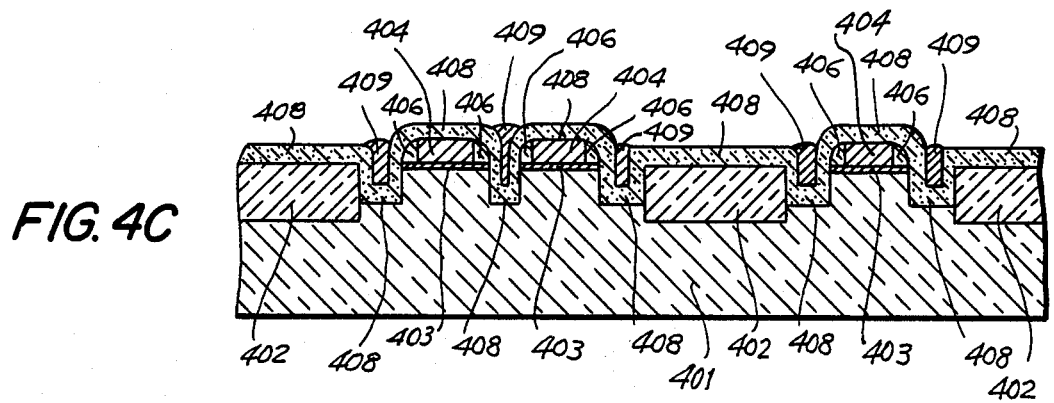

Referring to FIG. 4C, polycrystalline silicon layer 408 having a thickness of up to about 3000 Å is formed over the through surface of the device and the surface is coated with a resist pattern 409 having a thickness up to about $2\mu$. Resist pattern 409 is anisotropically etched, for example, by selectively using oxygen ($O_2$) reactive ion etching to maintain resist pattern 409 at the grooves.

Figure 4D:
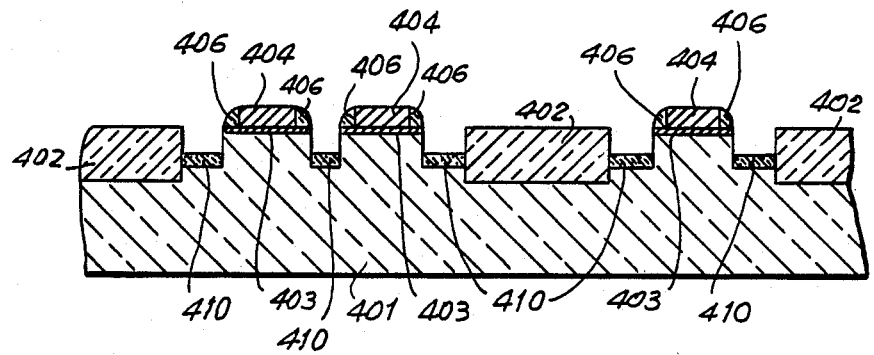
Figure 4E:
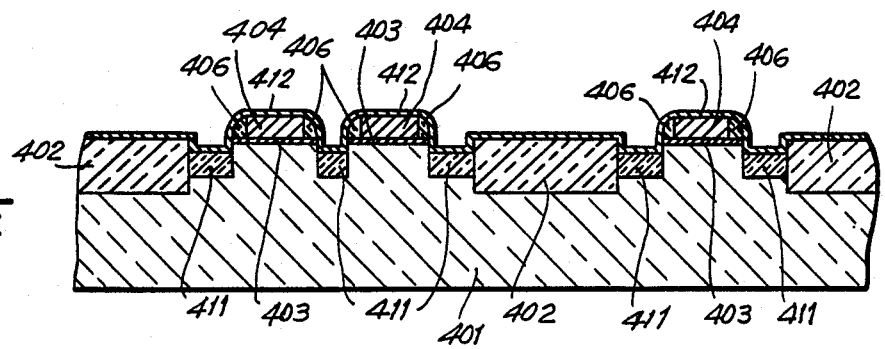

FIG. 4D shows polycrystalline silicon 410 that remains when polycrystalline silicon of this type of structure is anisotropically etched, for example using RIE. Referring to FIG. 4E, by thermally oxidizing polycrystalline silicon 410, silicon dioxide layer 411 is formed. This is equivalent to using gate electrode 404 as a mask to form element isolating silicon dioxide layer 402 and silicon dioxide layer 411 by a self-aligning process.

Silicon dioxide layer 411 at the side of the side wall should be slightly lower than the upper surface of the gate oxide film so as to expose a part of the silicon at the lower portion of the side wall. Then $TiSi_{2.5}$ (Ti:Si=2:5)/Ti layers 412 having thickness up to about 1000 and 600 Å, respectively, are deposited on the device.

Figure 4F:
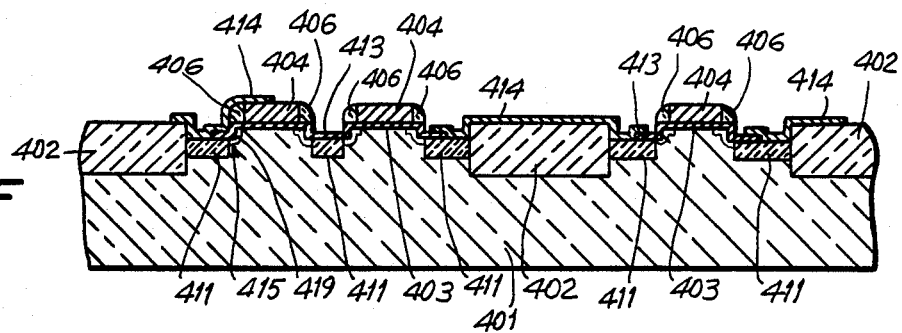

Referring to FIG. 4F, the device is lamp annealed in an argon gas atmosphere at 740° C. for 30 seconds and the silicon portion beneath sidewall $SiO_2$ film 406 is converted to $TiSi_2$. At the same time, silicon is diffused in the lateral direction and the $TiSi_2$ layer extends up to about $1\mu$ to form $TiSi_2$ layer 413. It is to be understood that it is not necessary for layer 412 to be a double layer of $TiSi_{2.5}$ and Ti. In fact, a Ti film alone is effective.

Accordingly, the $TiSi_2$ layer is divided into a gate region and source and drain regions. If the gate and a drain or the drain and another drain are to be connected, a $TiSi_{2.5}$/Ti layer is selectively maintained by ordinary photolithography and the desired $TiSi_2$ portion 413 and $TiSi_{2.5}$ 414 are formed by an etching process using $NH_4OH$ and $H_2O_2$ series etching solution. Alternatively, if the distance between the gate electrodes is short, the regions can be connected by a laterally extending $TiSi_2$ layer.

High concentration ions are implanted from above the $TiSi_2$ layer and the device is annealed at 1050° C. for twenty seconds to form diffused region 415 of the impurity extruded into the silicon from the $TiSi_2$ layer. A low concentration impurity in layer 419 is activated at the same time.

Figure 4G:
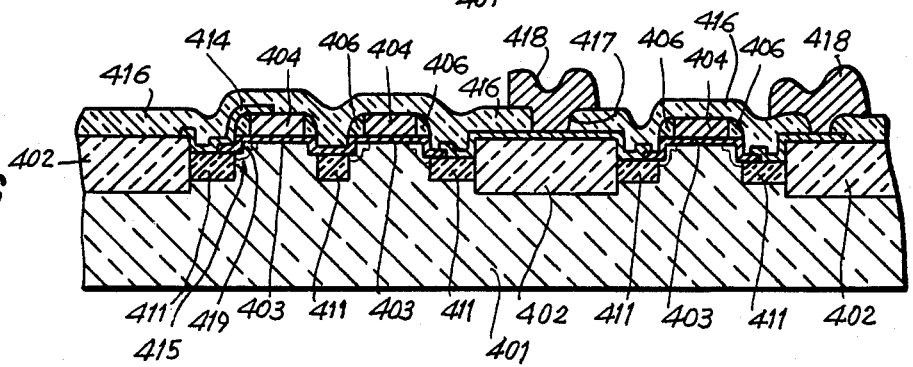

Referring to FIG. 4G, interlayer insulating film 416 is formed of silicon dioxide having a thickness up to about 6000 Å. Then contact hole 417 is formed on insulating film 416 and aluminum connector 418 is formed in the contact hole.

Figure 5:
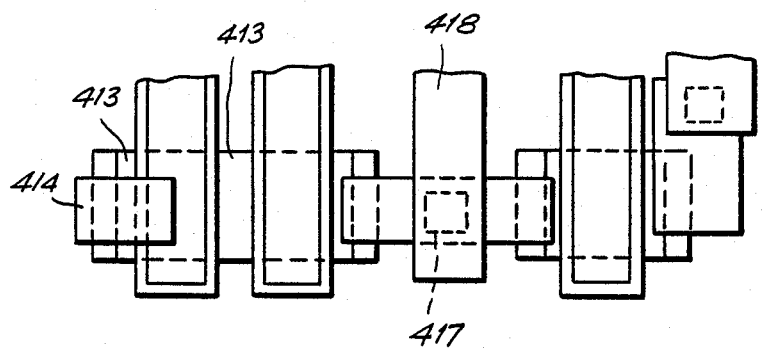
FIG. 5 is a plan view of a device manufactured in accordance with FIGS. 4A to 4G.

FIG. 5 is a plan view of the device shown in FIG. 4G. The carriers formed under the gate electrode are caught at the junction under the side wall silicon dioxide film 406 and delivered to the outside through $TiSi_2$. The $TiSi_2$ and $TiSi_{2.5}$ are selectively formed on element isolating silicon dioxide layer 411 using the gate electrode as a mask. Since there is no diffused region or silicon connector region as shown in the prior art, the junction capacitance is greatly reduced. Furthermore, a high integrity semiconductor device is provided in accordance with the invention.

In connection with the third and fourth embodiments, it is to be understood that although the polarity of the silicon substrate and of the source and drain regions is not specified, when the silicon substrate is of a P-type, the source and drain regions are of a N-type. Conversely, when the silicon substrate is N-type, the source and drain regions are P-type.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method for preparing a semiconductor device comprising:
    providing a semiconductor substrate:
    forming a gate insulating film on the semiconductor substrate;
    forming a gate electrode on the gate insulating film;
    forming an anti-anisotropic etching film on the gate electrode, said anti-anisotropic etching film being adapted to mask silicon so that the masked silicon can not be anisotropically etched;
    etching the gate electrode using the anti-anisotropic etching film as a mask;
    forming a diffused source and drain region in the substrate using the gate electrode as a mask;
    forming a first insulating film on the substrate and the anti-anisotropic etching film;
    selectively etching the first insulating film by an anisotropic etching process to form a side wall insulating film at the side of the gate electrode overlapping a portion of the diffused regions in plan view; and
    etching the substrate in the region of the remainder of the diffused regions using the anti-anisotropic etching film and the side wall insulating film as a mask so as to form a groove in the substrate by a self-aligning process with a portion of the diffused region masked by the side wall insulating film remaining.

2. The method of claim 1 further comprising:
    forming a capacitor oxide film in the groove by thermal oxidation; and
    forming a polycrystalline silicon on the capacitor oxide film so as to form a capacitor electrode.

3. The method of claim 2 further comprising:
    forming an interlayer insulating oxide film on the device;
    providing a resist pattern mask on the interlayer insulating oxide film;
    etching the interlayer insulating oxide film to form a contact hole; and
    providing a connector material in the contact hole.

4. The method of claim 1 further comprising;

forming element isolating oxide regions in the semiconductor substrate prior to forming the gate insulating film; and, forming the gate insulating film between adjacent element isolating oxide regions.

5. The method of claim 1, wherein the semiconductor substrate is a P-type semiconductor substrate.

6. The method of claim 1, wherein the gate insulating film is formed by thermal oxidation.

7. The method of claim 1, wherein the gate electrode includes a polycrystalline silicon layer on the gate insulating film and a nitride film on the polycrystalline silicon layer.

8. The method of claim 7, wherein the polycrystalline silicon layer is formed by chemical vapor deposition to a thickness between about 1500 and 4000 Å.

9. The method of claim 8, wherein phosphorus is thermally diffused into the polycrystalline silicon layer at a temperature between about 800° and 1000° C.

10. The method of claim 7, wherein the nitride film is formed by chemical vapor deposition to a thickness between about 2000 and 4000 Å.

11. The method of claim 1, wherein the anti-anisotropic etching film is a one of a nitride film or silicide film and having a thickness between about 100 and 200 Å.

12. The method of claim 1, wherein the diffused region is formed by ion implantation of an N-type impurity and annealing of the device.

13. The method of claim 1, wherein the first insulating film is a nitride film.

14. The method of claim 13, wherein the nitride film is formed by chemical vapor deposition to a thickness between about 2000 and 4000 Å.

15. The method of claim 1, wherein the first insulating film is selectively etched by reactive ion etching.

16. The method of claim 1 further comprising masking at least a portion of the diffused region and removing the gate insulating film on the unmasked portion prior to etching the substrate.

17. The method of claim 16, wherein the gate insulating film is removed using dilute hydrofluoric acid.

18. The method of claim 1, wherein the substrate is etched by reactive ion etching.

19. The method of claim 2, wherein the polycrystalline silicon is formed on the capacitor oxide film by chemical vapor deposition and is etched using a resist pattern mask to form the capacitor electrode.

20. The method of claim 3, wherein the interlayer insulating oxide film is formed by chemical vapor deposition to a thickness between about 3000 and 6000 Å.

21. The method of claim 3, wherein the connector material is aluminum.

22. The method of claim 3, wherein the connector material is formed by sputtering.

23. The method of claim 1 further comprising:
coating the entire surface of the device with a silica series coating film after selectively etching the first insulating film;
baking the coated device at a temperature between about 100° and 200° C.;
annealing the device in a nitride atmosphere at a temperature between about 800° and 1000° C.; and
reducing the thickness of the silica series coating film using dilute hydrofluoric acid prior to etching the substrate.

24. The method of claim 23, wherein the silica series coating film is provided by spin coating.

25. The method of claim 1, wherein the gate electrode includes a polycrystalline silicon layer on the gate insulating film and a molybdenum film on the polycrystalline silicon layer.

26. The method of claim 25, wherein the polycrystalline silicon layer is formed by chemical vapor deposition to a thickness between about 1500 and 4000 Å and wherein phosphorus is thermally diffused into the polycrystalline silicon layer at a temperature between about 800° and 1000° C.

27. The method of claim 25, wherein the molybdenum film is formed by chemical vapor deposition to a thickness between about 2000 and 4000 Å.

28. The method of claim 4, wherein the gate electrode is a tungsten film.

29. The method of claim 1 further comprising:
forming an element isolating oxide film in the groove so that a portion of the semiconductor substrate at the side portion of the groove beneath the side wall insulating film is exposed;
introducing an impurity into the exposed portion of the semiconductor substrate to form secondary source and drain regions in a region below the source and drain regions masked by the side wall;
forming connectors from the secondary source and drain regions across the element isolating oxide film;
forming an interlayer insulating film on the entire surface of the device;
forming a contact hole in the interlayer insulating film over the connector; and
forming an upper layer connector for electrically connecting the secondary source and drain regions through the contact hole.

30. The method of claim 1 further comprising:
coating the device with glass;
annealing the glass-coated device to form a stopper layer and an element isolating oxide film;
selectively etching the glass to expose a portion of the substrate;
depositing a layer of titanium on the gate electrode, the side wall insulating film and the exposed portion of the substrate;
annealing the titanium layer which contacts the substrate to form $Ti_xSi_y$ to form source and drain regions;
diffusing an impurity by ion implantation for form diffused regions beneath the $Ti_xSi_y$;
forming a protective layer on the $Ti_xSi_y$ layer and on the gate electrode to separate the gate, source and drain regions; and,
forming a connector between adjacent gate electrodes by contact etching.

31. The method of claim 30, wherein the glass is boron silicate glass having a thickness up to about 8000 Å.

32. The method of claim 30, wherein the glass is annealed for 30 seconds at a temperature of about 1000° C.

33. The method of claim 29, wherein the substrate is of a first conductive type and the diffused regions are of a second conductive type.

34. The method of claim 1, wherein the anti-anisotropic etching film is molybdenum silicide.

35. The method of claim 1 further comprising:
depositing a layer of titanium on the gate electrode, the side wall insulating film and the exposed portion of the substrate;

annealing the titanium layer which contacts the substrate to form $Ti_xSi_y$ to form source and drain regions;

diffusing an impurity by ion implantation for form diffused regions beneath the $Ti_xSi_y$;

forming a protective layer on the $Ti_xSi_y$ layer and on the gate electrode to separate the gate, source and drain regions; and, forming a connector between adjacent gate electrodes by contact etching.

* * * * *